(12) United States Patent
Chen et al.

(10) Patent No.: US 12,346,176 B2
(45) Date of Patent: Jul. 1, 2025

(54) THERMAL MANAGEMENT APPARATUS FOR AN INFORMATION HANDLING SYSTEM

(71) Applicant: Dell Products L.P., Round Rock, TX (US)

(72) Inventors: Enoch Chen, Taipei (TW); Travis C. North, Cedar Park, TX (US); Pomin Shih, Taipei (TW)

(73) Assignee: Dell Products L.P., Round Rock, TX (US)

( * ) Notice: Subject to any disclaimer, the term of this patent is extended or adjusted under 35 U.S.C. 154(b) by 269 days.

(21) Appl. No.: 18/298,769

(22) Filed: Apr. 11, 2023

(65) Prior Publication Data
US 2024/0345638 A1 Oct. 17, 2024

(51) Int. Cl.
*G06F 1/20* (2006.01)
*H05K 7/20* (2006.01)

(52) U.S. Cl.
CPC ......... *G06F 1/203* (2013.01); *H05K 7/20145* (2013.01); *H05K 7/20172* (2013.01); *H05K 7/20209* (2013.01)

(58) Field of Classification Search
CPC ....................................................... G06F 1/203
See application file for complete search history.

(56) References Cited

U.S. PATENT DOCUMENTS

| | | | | |
|---|---|---|---|---|
| 7,589,965 B2* | 9/2009 | Liang | ................. | H05K 7/20154 165/122 |
| 9,845,805 B2* | 12/2017 | Bhutani | ................... | G06F 1/20 |
| 10,035,224 B2* | 7/2018 | Peterson | ................. | F04D 17/00 |
| 10,423,200 B1* | 9/2019 | North | .................... | G06F 1/1616 |
| 11,262,821 B1* | 3/2022 | North | .................... | G06F 1/3296 |
| 11,477,911 B1* | 10/2022 | He | ........................ | H01L 23/427 |
| 11,592,881 B2* | 2/2023 | Yang | ........................ | F28F 9/26 |
| 11,758,685 B2* | 9/2023 | North | ................ | H05K 7/20554 361/695 |
| 11,913,472 B2* | 2/2024 | Chen | ..................... | F04D 29/281 |
| 11,968,800 B2* | 4/2024 | Chen | ........................ | G06F 1/20 |
| 11,968,806 B2* | 4/2024 | Kitamura | ............... | G06F 1/203 |
| 12,096,598 B2* | 9/2024 | Sano | .................. | H05K 7/20336 |
| 12,140,159 B2* | 11/2024 | Chen | .................. | F04D 29/4226 |
| 12,185,494 B2* | 12/2024 | Chen | ................. | H05K 7/20154 |
| 2018/0112669 A1* | 4/2018 | Bhutani | .................... | G06F 1/20 |
| 2022/0377933 A1* | 11/2022 | North | ................ | H05K 7/20145 |
| 2024/0032236 A1* | 1/2024 | Chen | ................. | H05K 7/20154 |
| 2024/0141922 A1* | 5/2024 | Chen | .................. | F04D 29/4226 |
| 2024/0258610 A1* | 8/2024 | Vichare | ............. | H01M 10/6563 |
| 2024/0345638 A1* | 10/2024 | Chen | ................. | H05K 7/20145 |

* cited by examiner

*Primary Examiner* — Lisa Lea-Edmonds
(74) *Attorney, Agent, or Firm* — McDermott Will & Emery LLP

(57) ABSTRACT

A thermal management apparatus, including: a blower, including: an impeller configured to direct airflow towards an egress; a base; and a cover, wherein the cover is coupled to the base to encase the impeller; a fin-stack configured to receive the airflow and transfer heat from the airflow, including: a plate having a perimeter; internal fins coupled to the plate and contained within the perimeter of the plate; and external fins extending external to the perimeter of the plate, wherein the fin-stack is coupled to the blower such that the external fins are positioned between the base and the cover, the external fins configured to distribute the airflow across the egress and the internal fins of the fin-stack.

18 Claims, 16 Drawing Sheets

THERMAL MANAGEMENT APPARATUS FOR AN INFORMATION HANDLING SYSTEM

BACKGROUND

Field of the Disclosure

The disclosure relates generally to an information handling system, and in particular, a thermal management apparatus for an information handling system.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Traditional blowers can provide non-uniform air flow across an egress of the blower. This can result in concerns regarding heat dissipation efficiency and thermal performance of the information handling system.

SUMMARY

Innovative aspects of the subject matter described in this specification may be embodied in a thermal management apparatus, including: a blower, including: an impeller configured to direct airflow towards an egress; a base; and a cover, wherein the cover is coupled to the base to encase the impeller; a fin-stack configured to receive the airflow and transfer heat from the airflow, including: a plate having a perimeter; internal fins coupled to the plate and contained within the perimeter of the plate; and external fins extending external to the perimeter of the plate, wherein the fin-stack is coupled to the blower such that the external fins are positioned between the base and the cover, the external fins configured to distribute the airflow across the egress and the internal fins of the fin-stack.

Other embodiments of these aspects include corresponding systems and apparatus.

These and other embodiments may each optionally include one or more of the following features. For instance, the thermal management apparatus is included by an information handling system. The base includes coupling members, wherein the external fins are coupled to the coupling members of the base when the fin-stack is coupled to the blower. At least one of the external fins has a curvature. At least one of the external fins has a first curvature and a second curvature, the first curvature a positive curvature and the second curvature a negative curvature. A first external fin of the external fins has a first length and a second external fin of the external fins has a second length, the first length greater than the second length. An end the first external fin is spaced-apart from the impeller a first distance and an end of the second external fin is spaced-apart from the impeller a second distance, the first distance greater than the second distance. The impeller is an ultra-thin plate impeller. The external fins are coupled to the cover of the blower. The external fins are welded to the cover of the blower. The cover of the blower is copper, and the external fins are welded to the cover of the blower.

Particular implementations of the subject matter described in this specification can be implemented so as to realize one or more of the following advantages. For example, cooling performance of the information handling system is maximized.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF PARTICULAR EMBODIMENT(S)

Figure 1:
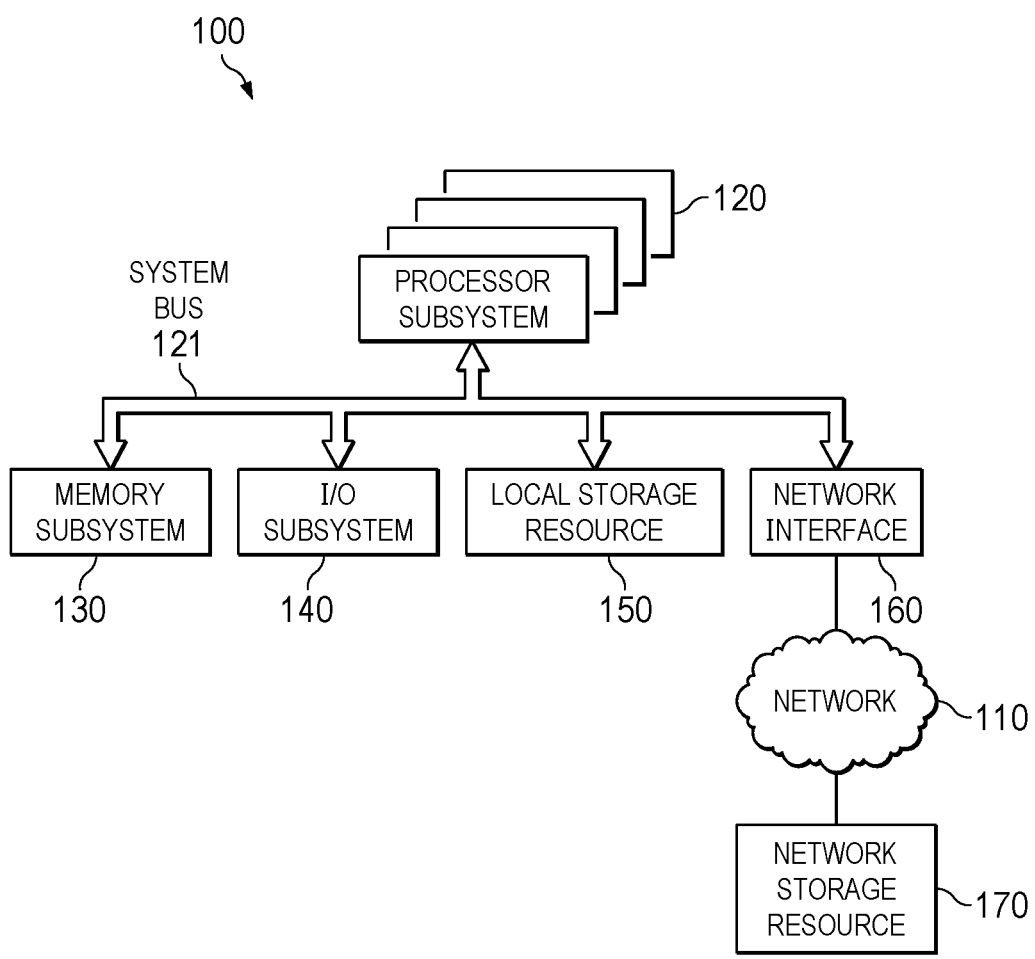
FIG. 1 is a block diagram of selected elements of an embodiment of an information handling system.

This disclosure discusses a thermal management apparatus of an information handling system. In short, this disclosure discusses a thermal management apparatus, including a blower, including: an impeller configured to direct airflow towards an egress; a base; and a cover, wherein the cover is coupled to the base to encase the impeller; a fin-stack configured to receive the airflow and transfer heat from the airflow, including: internal fins contained within a boundary of the fin-stack; and external fins extending external to the boundary of the fin-stack, wherein the fin-stack is coupled to the blower such that the external fins are positioned between the base and the cover, the external fins configured to distribute the airflow across the egress and the internal fins of the fin-stack.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-13 wherein like numbers are used to indicate like and corresponding parts.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

Figure 2:
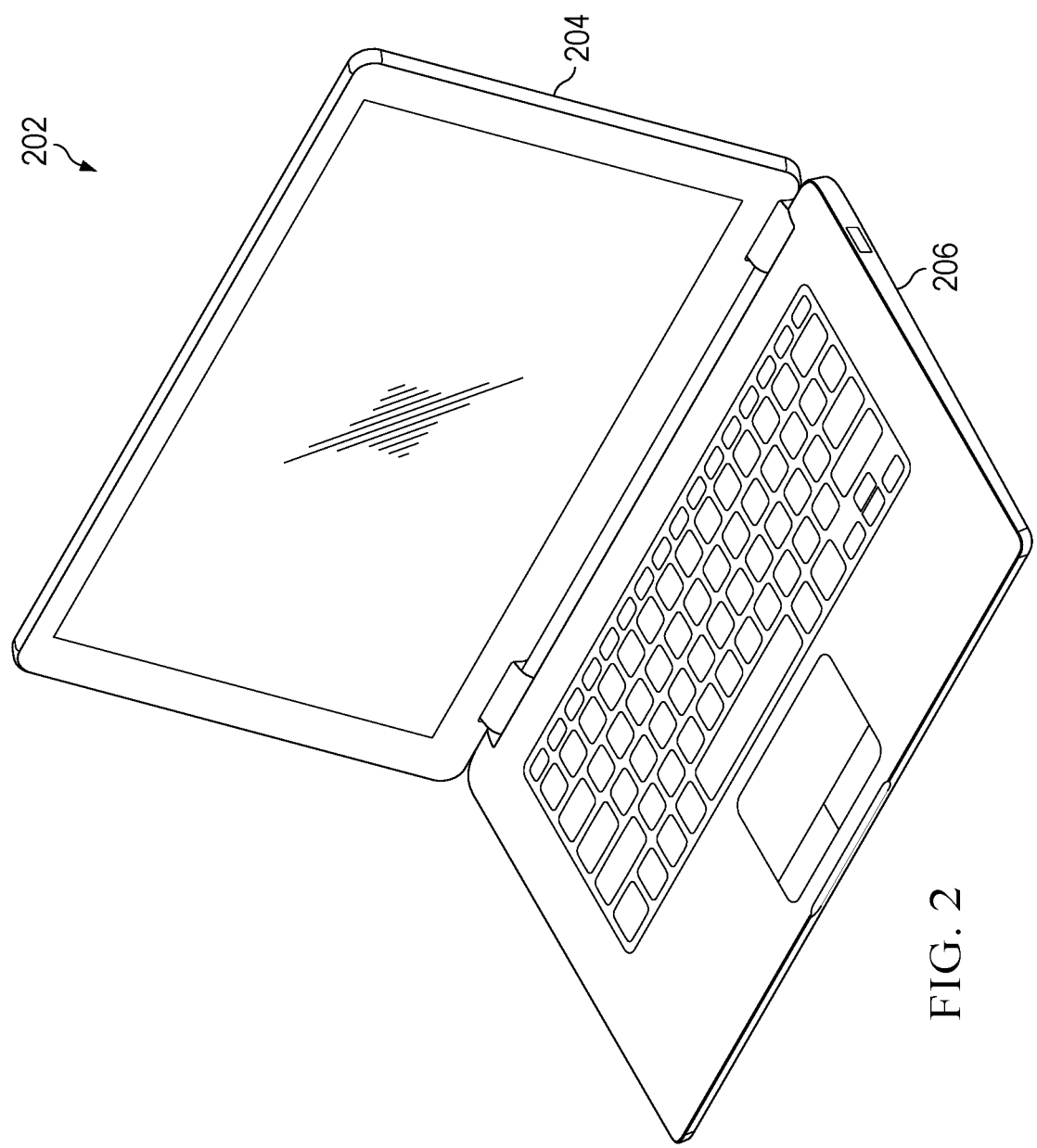
FIG. 2 illustrates a block diagram of an information handling system.

Turning to FIG. 2, FIG. 2 illustrates an information handling system 202. The information handling system 202 can include a first body 204 and a second body 206. In some examples, the information handling system 202 is similar to, or includes, the information handling system 100 of FIG. 1.

Figure 3:
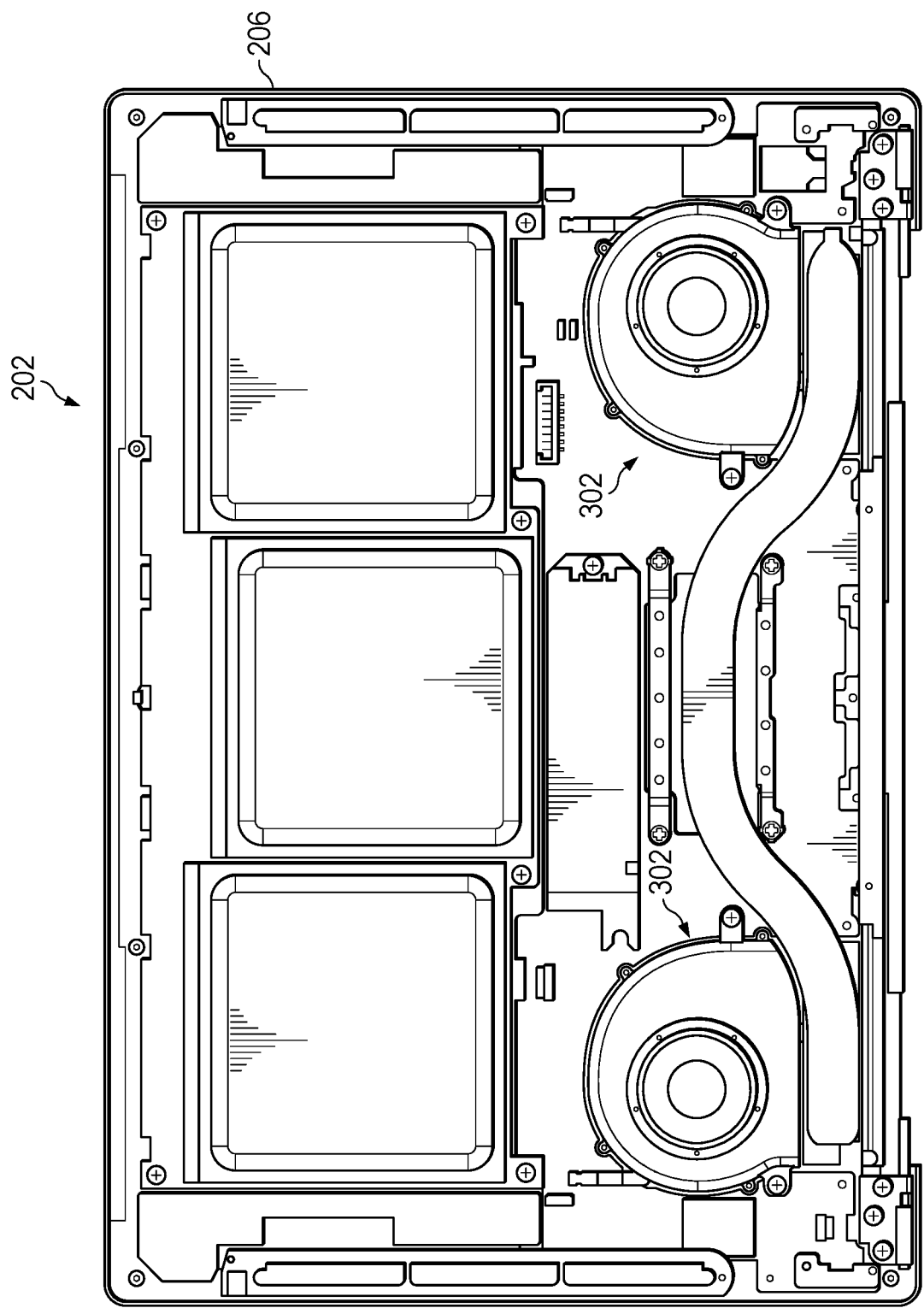
FIG. 3 illustrates a bottom view of a second body of the information handling system.

FIG. 3 illustrates a bottom view of the second body 206 of the information handling system 202. The information handling system 202 can include a thermal management apparatus 302 (or multiple thermal management apparatuses 302). The thermal management apparatus 302 can be coupled to (or included by) the information handling system 202, and more specifically, coupled to a cover of the information handling system 202.

Figure 4A:
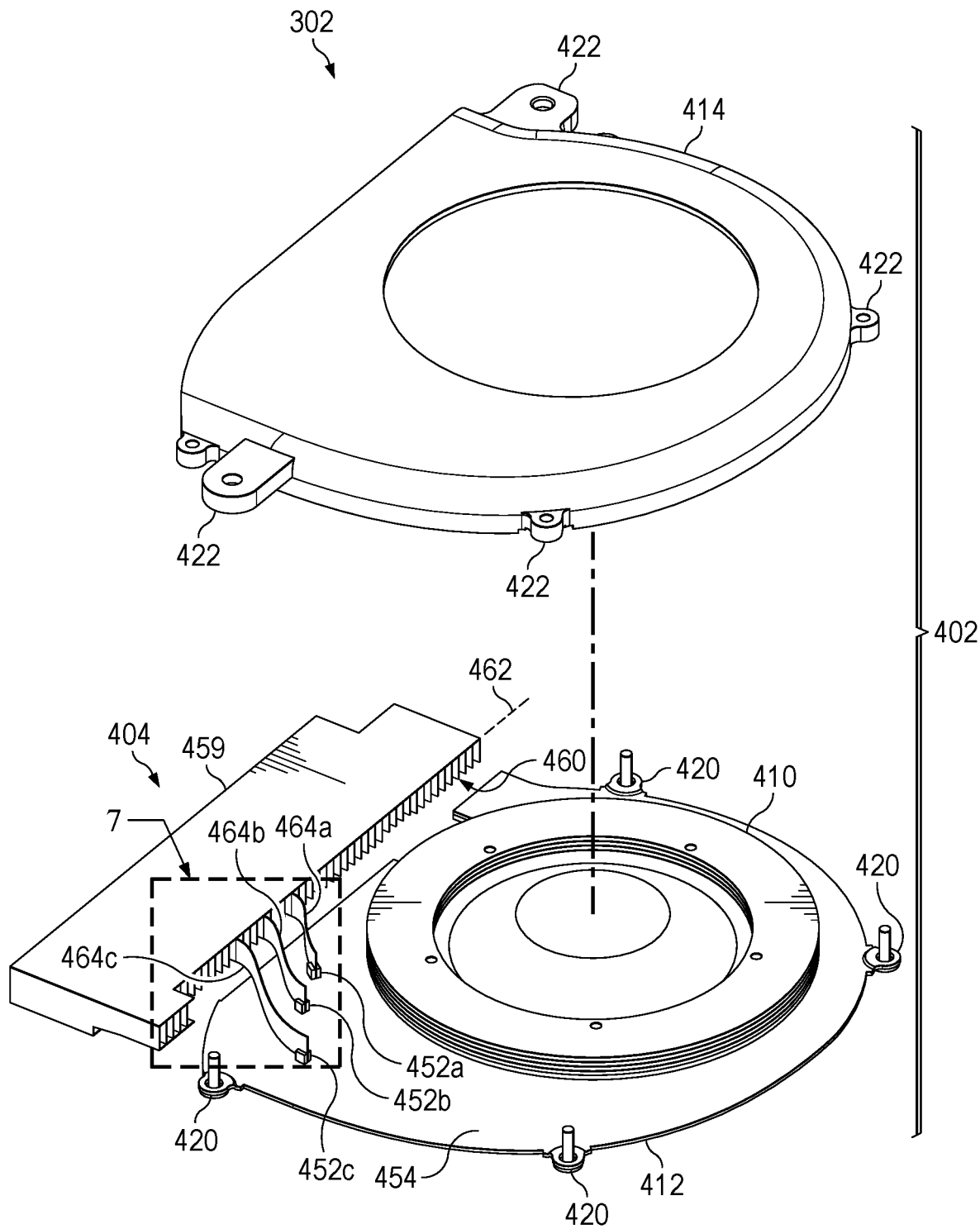
FIG. 4A illustrates an exploded perspective view of a thermal management apparatus, in a first implementation.
Figure 4B:
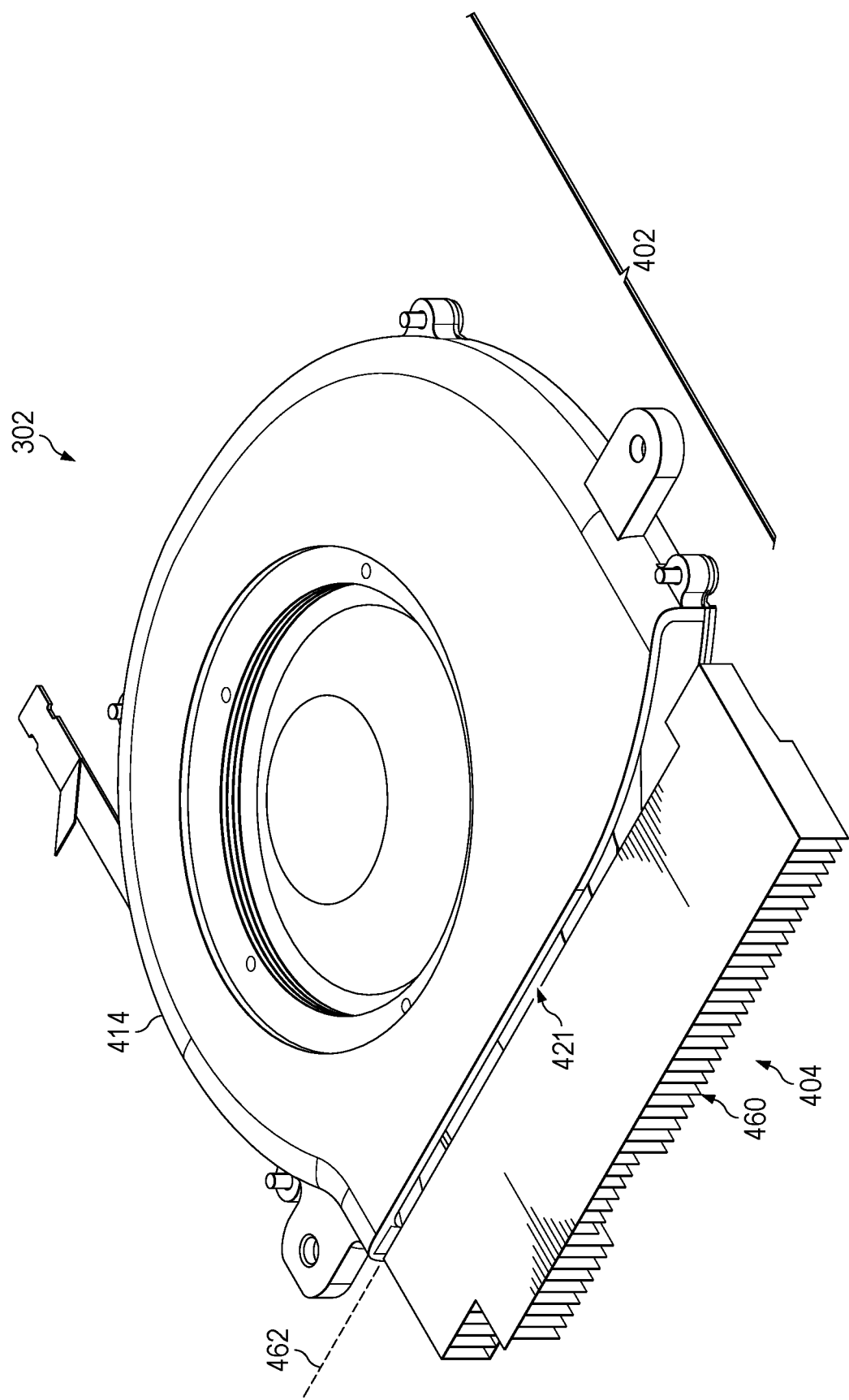
FIG. 4B illustrates an assembled perspective view of the thermal management apparatus, in the first implementation.

FIG. 4A illustrates an exploded perspective view of the thermal management apparatus 302, in a first implementation; and FIG. 4B illustrates an assembled perspective view of the thermal management apparatus 302, in the first implementation. Referring to FIGS. 4A, 4B, the thermal management apparatus 302 can include a blower 402 and a fin-stack 404. The blower 402 can include an impeller 410, a base 412, and a cover 414.

The cover 414 is configured to be coupled to the base 412. Specifically, the base 412 can include coupling members 420; and the cover 414 can include coupling members 422. The coupling members 420 of the base 412 can be coupled to the coupling members 422 of the cover 414 to couple the cover 414 to the base 412. Additionally, when the cover 414 is coupled to the base 412, the impeller 410 can be encased by the cover 414 coupled to the base 412, forming the blower 402.

Figure 5:
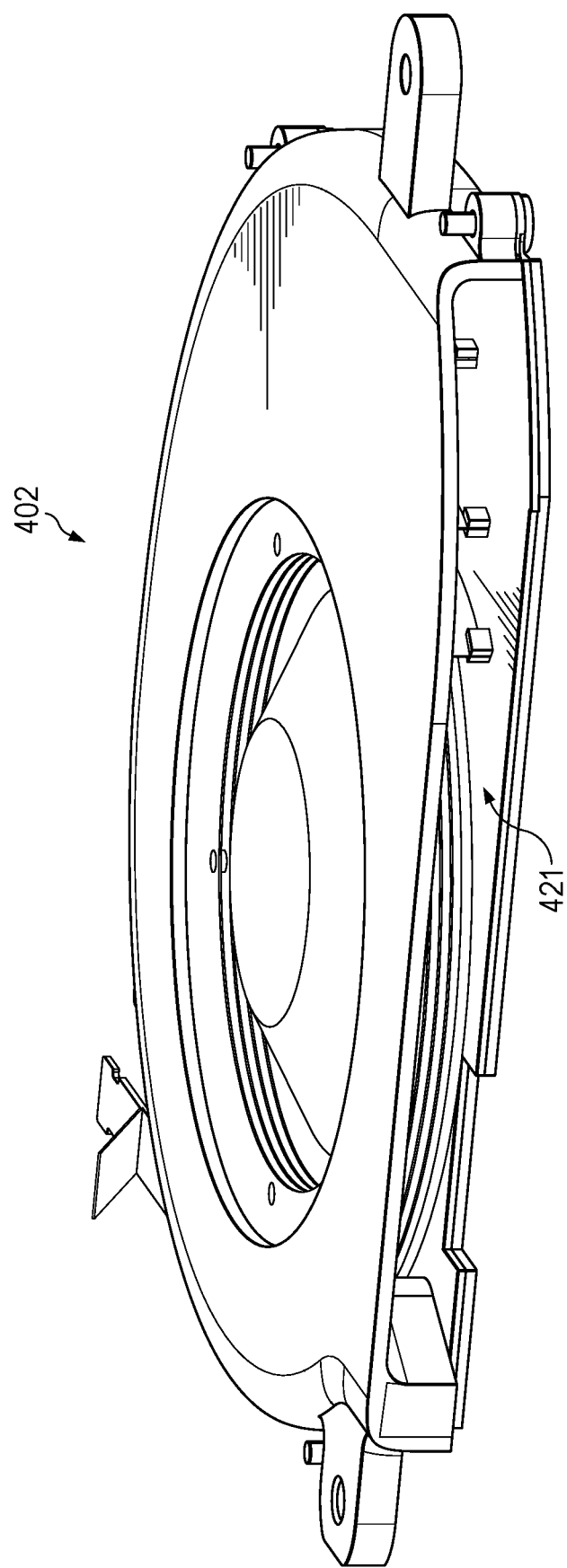
FIG. 5 illustrates a perspective view of a blower of the thermal management apparatus, in the first implementation.

The impeller 410 is configured to direct airflow towards an egress 421 of the blower 402, shown more clearly in FIG. 5. In some examples, the blower 402 can be an ultra-thin plate (UTP) blower.

Figure 6:
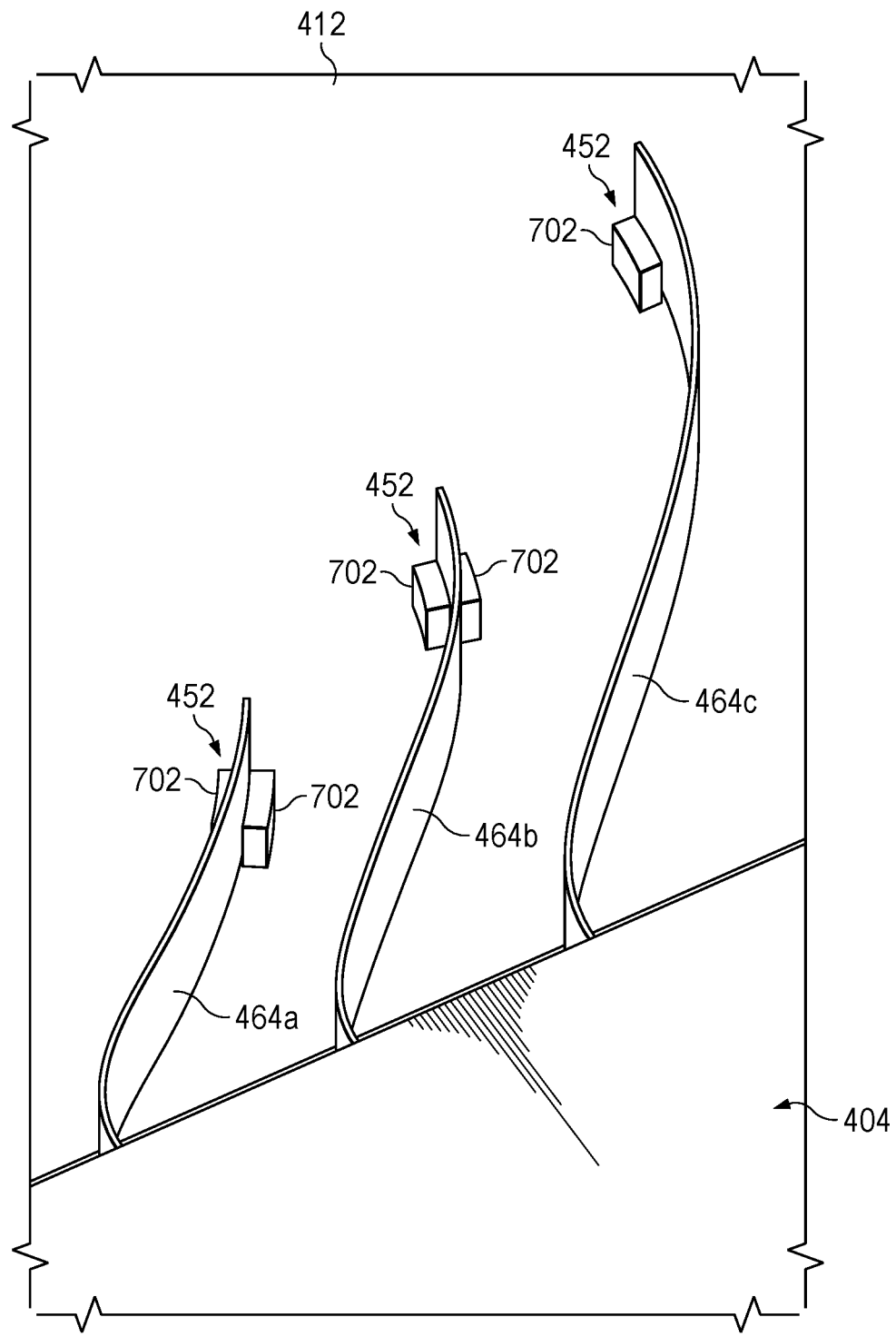
FIG. 6 is a close-up view of coupling members of the blower, in the first implementation.

In some examples, the cover 412 can further include coupling members 452a, 452b, 452c (collectively referred to as coupling members 452). The coupling members 452 extend away from a surface 454 of the cover 412. As shown in FIG. 6, the coupling members 452 can include opposing tabs 702.

The fin-stack 404 can include a plate 459 and internal fins 460. The plate 459 can include a perimeter 462. The internal fins 460 can be coupled to the plate 459 and contained within the perimeter 462 (or boundary 462) of the plate 459. The fin-stack 404 can further include external fins 464a, 464b, 464c (collectively referred to as external fins 464). The external fins 464 can be external, or outside of, the perimeter 462. In some examples, the external fins 464 are coupled with one or more of the internal fins 460. In some examples, the external fins 464 are formed with one or more internal fins 460 as a congruent body. The fin-stack 404 can include any number of external fins 464.

Figure 7:
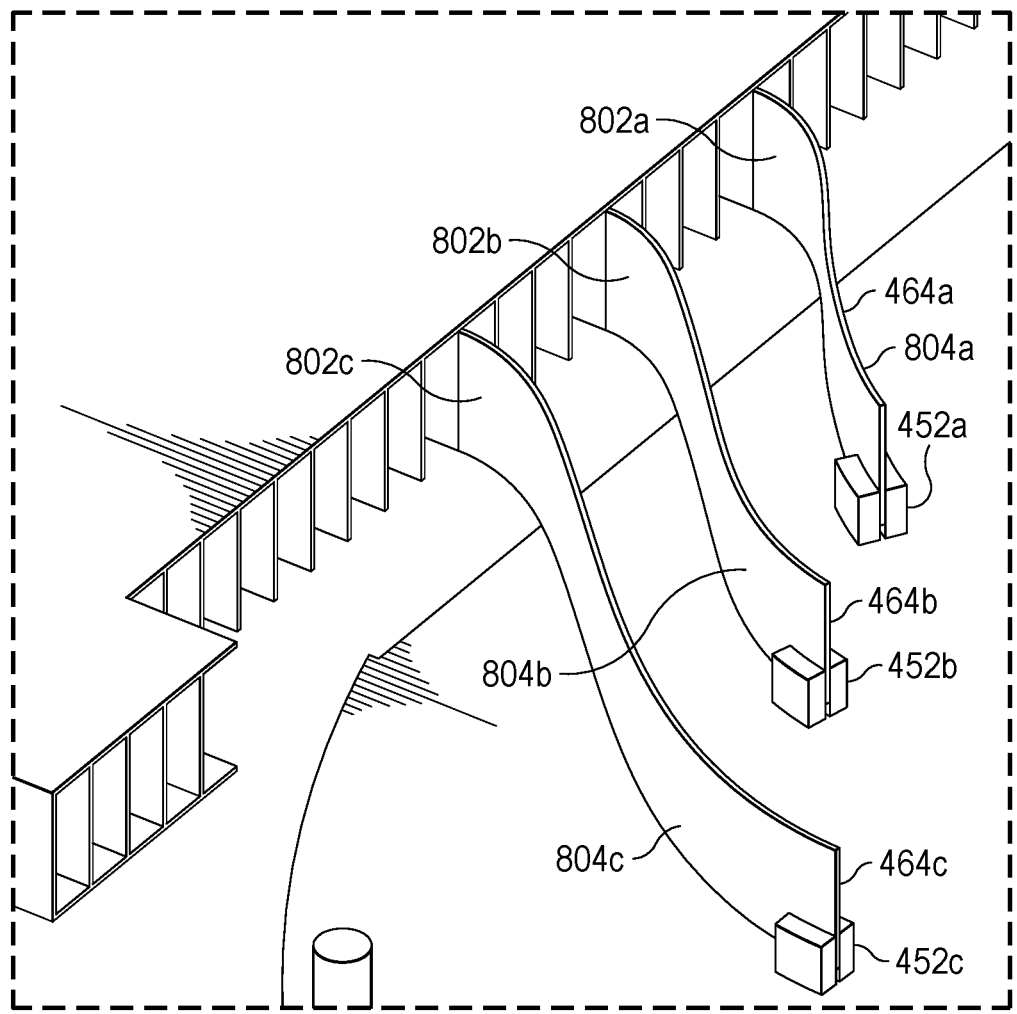
FIG. 7 illustrates a close-up view of a portion of the cover and the fin-stack, in the first implementation.

FIG. 7 illustrates a close-up view of a portion of the cover 412 and the fin-stack 404. Specifically, the external fin 464a is coupled to the coupling member 452a; the external fin 464b is coupled to the coupling member 452b; and the external fin 464c is coupled to the coupling member 452c. Each of the external fins 464 can include a curvature. Specifically, in the illustrated example, the external fin 464a includes a first curvature 802a and a second curvature 804a; the external fin 464b includes a first curvature 802b and a second curvature 804b; and the external fin 464c includes a first curvature 802c and a second curvature 804c. However, the external fins 464 can include any number of curvatures. Additionally, a subset of the external fins 464 can include a curvature and remaining external fins 464 can be substantially straight.

In some examples, the first curvatures 802a, 802b, 802c (collectively referred to as first curvature 802) are positive curvatures; and the second curvatures 804a, 804b, 804c (collectively referred to as second curvatures 804) are negative curvatures. In some examples, the first curvatures 802a, 802b, 802c are opposing to the second curvatures 804a, 804b, 804c, respectively.

In some examples, each of the external fins 464 are of a same length. In some examples, a subset of the external fins 464 are of the same length. In some examples, each of the external fins 464 are of differing lengths.

In some examples, a length of the external fin 464c is greater than a length of the external fin 464b. In some examples, the length of the external fin 464b is greater than a length of the external fin 464a.

Referring to FIGS. 4A and 7, in some examples, the external fin 464a is spaced-apart from the impeller 410 a first distance; the external fin 464b is spaced-apart from the impeller 410 a second distance; and the external fin 464c is spaced-apart from the impeller 410 a third distance. In some examples, the third distance is greater than the second distance; and the second distance is greater than the first distance.

Referring to FIG. 4B, to that end, the fin-stack 404 is coupled to the blower 402. The fin-stack 404 is configured to receive the airflow from the impeller 410 (through the egress 421) and transfer heat from the airflow (e.g., remove heat from the airflow). Furthermore, the fin-stack 404 is coupled to the blower 402 such that the external fins 464 are positioned between the base 412 and the cover 414. In some examples, when the fin-stack 404 is coupled to the blower 402, the external fins 464 are coupled to respective coupling members 452 of the base 412. That is, the external fins 464 are positioned between opposing tabs 702 of the respective coupling members 452 of the base 412, as shown in FIGS. 6 and 7. In some examples, when the fin-stack 404 is coupled to the blower 402, the external fins 464 can additionally contact the cover 414.

Moreover, when the fin-stack 404 is coupled to the blower 402 such that the external fins 464 are positioned between the base 412 and the cover 414, the external fins 464 are configured to distribute the airflow across the egress 421 and the internal fins 460 of the fin-stack 404. That is, as the impeller 410 directs the airflow towards the egress 421, the external fins 464 distribute such airflow across the egress 421 and the internal fins 460 of the fin-stack 404. In some examples, the external fins 464 distribute such airflow across the egress 421 such that airflow is evenly distributed across the egress 421.

In some examples, the first curvatures 802 and the second curvatures 804 of the external fins 464 distribute the airflow across the egress 421 and the internal fins 460 of the fin-stack 404. In some examples, the first curvatures 802 and the second curvatures 804 of the external fins 464 distribute the airflow across the egress 421 such that airflow is evenly distributed across the egress 421.

In some examples, the combination of the length and positioning of each of the external fins 464 distribute the airflow across the egress 421 and the internal fins 460 of the fin-stack 404. That is, the length of the external fin 464c greater than the length of the external fin 464b and the external fin 464c is spaced-apart from the impeller 410 the third distance greater than the second distance the external fin 464b is spaced-apart from the impeller 410 distributes the airflow across the egress 421 and the internal fins 460 of the fin-stack 404. In some examples, the length of the external fin 464c greater than the length of the external fin 464b and the external fin 464c is spaced-apart from the impeller 410 the third distance greater than the second distance the external fin 464b is spaced-apart from the impeller 410 distributes the airflow across the egress 421 such that airflow is evenly distributed across the egress 421. That is, the length of the external fin 464b greater than the length of the external fin 464a and the external fin 464b is spaced-apart from the impeller 410 the second distance greater than the first distance the external fin 464a is spaced-apart from the impeller 410 distributes the airflow across the egress 421 and the internal fins 460 of the fin-stack 404. In some examples, the length of the external fin 464b greater than the length of the external fin 464a and the external fin 464b is spaced-apart from the impeller 410 the second distance greater than the first distance the external fin 464a is spaced-apart from the impeller 410 distributes the airflow across the egress 421 such that airflow is more evenly distributed across the egress 421.

In some examples, the combination of the first curvatures 802, the second curvatures 804, the length, and positioning of each of the external fins 464 distribute the airflow across the egress 421 and the internal fins 460 of the fin-stack 404. That is, the first curvatures 802 and the second curvatures 804 of the external fins 464b, 464c and the length of the external fin 464c greater than the length of the external fin 464b and the external fin 464c is spaced-apart from the impeller 410 the third distance greater than the second distance the external fin 464b is spaced-apart from the impeller 410 distributes the airflow across the egress 421 and the internal fins 460 of the fin-stack 404. In some examples, the first curvatures 802 and the second curvatures 804 of the external fins 464b, 464c and the length of the external fin 464c greater than the length of the external fin 464b and the external fin 464c is spaced-apart from the impeller 410 the third distance greater than the second distance the external fin 464b is spaced-apart from the impeller 410 distributes the airflow across the egress 421 such that airflow is evenly distributed across the egress 421. That is, the first curvatures 802 and the second curvatures 804 of the external fins 464a, 464b and the length of the external fin 464b greater than the length of the external fin 464a and the external fin 464b is spaced-apart from the impeller 410 the second distance greater than the first distance the external fin 464a is spaced-apart from the impeller 410 distributes the airflow across the egress 421 and the internal fins 460 of the fin-stack 404. In some examples, the first curvatures 802 and the second curvatures 804 of the external fins 464a, 464b and the length of the external fin 464b greater than the length of the external fin 464a and the external fin 464b is spaced-apart from the impeller 410 the second distance greater than the first distance the external fin 464a is spaced-apart from the impeller 410 distributes the airflow across the egress 421 such that airflow is evenly distributed across the egress 421.

Figure 8A:
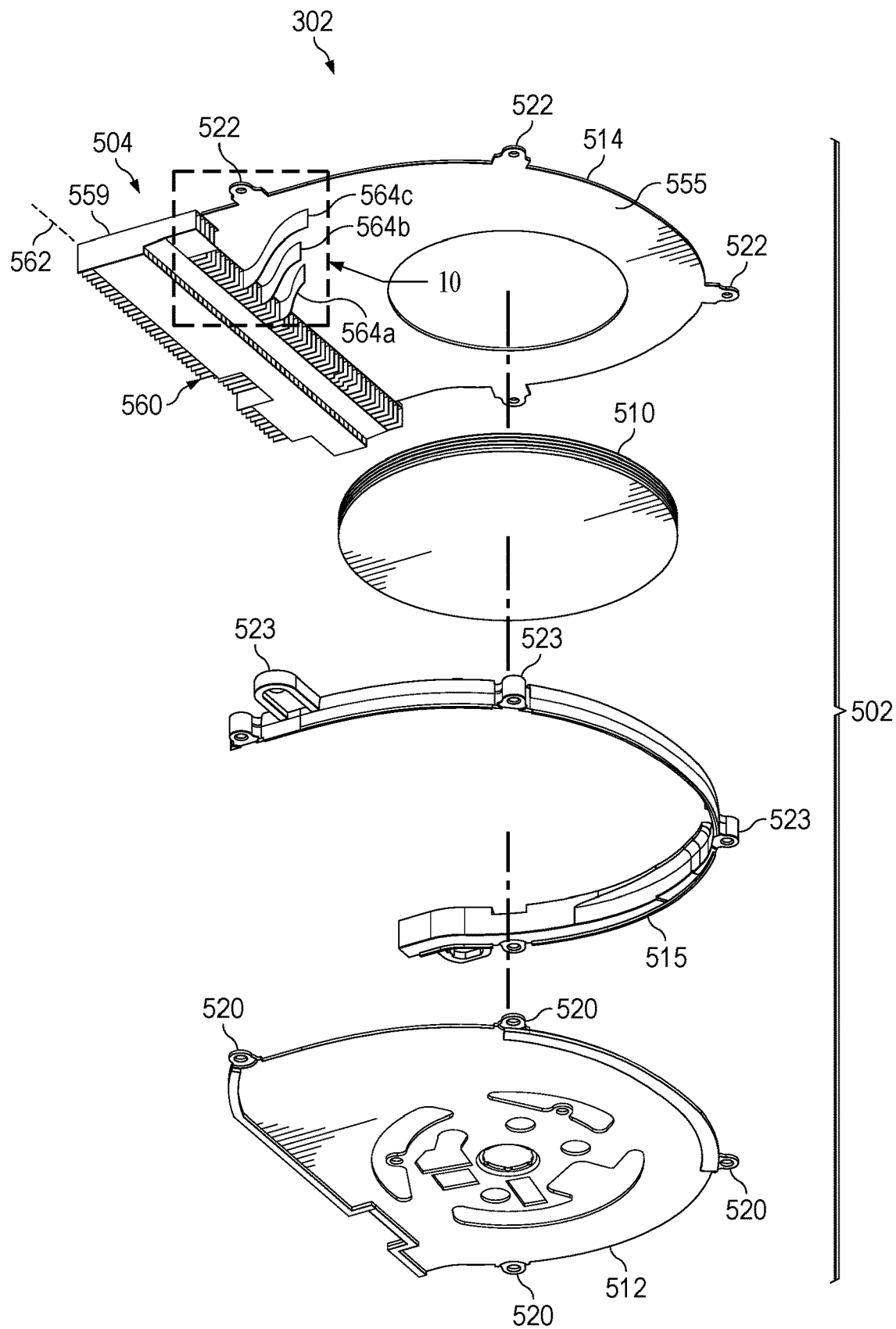
FIG. 8A illustrates an exploded perspective view of the thermal management apparatus, in a second implementation.
Figure 8B:
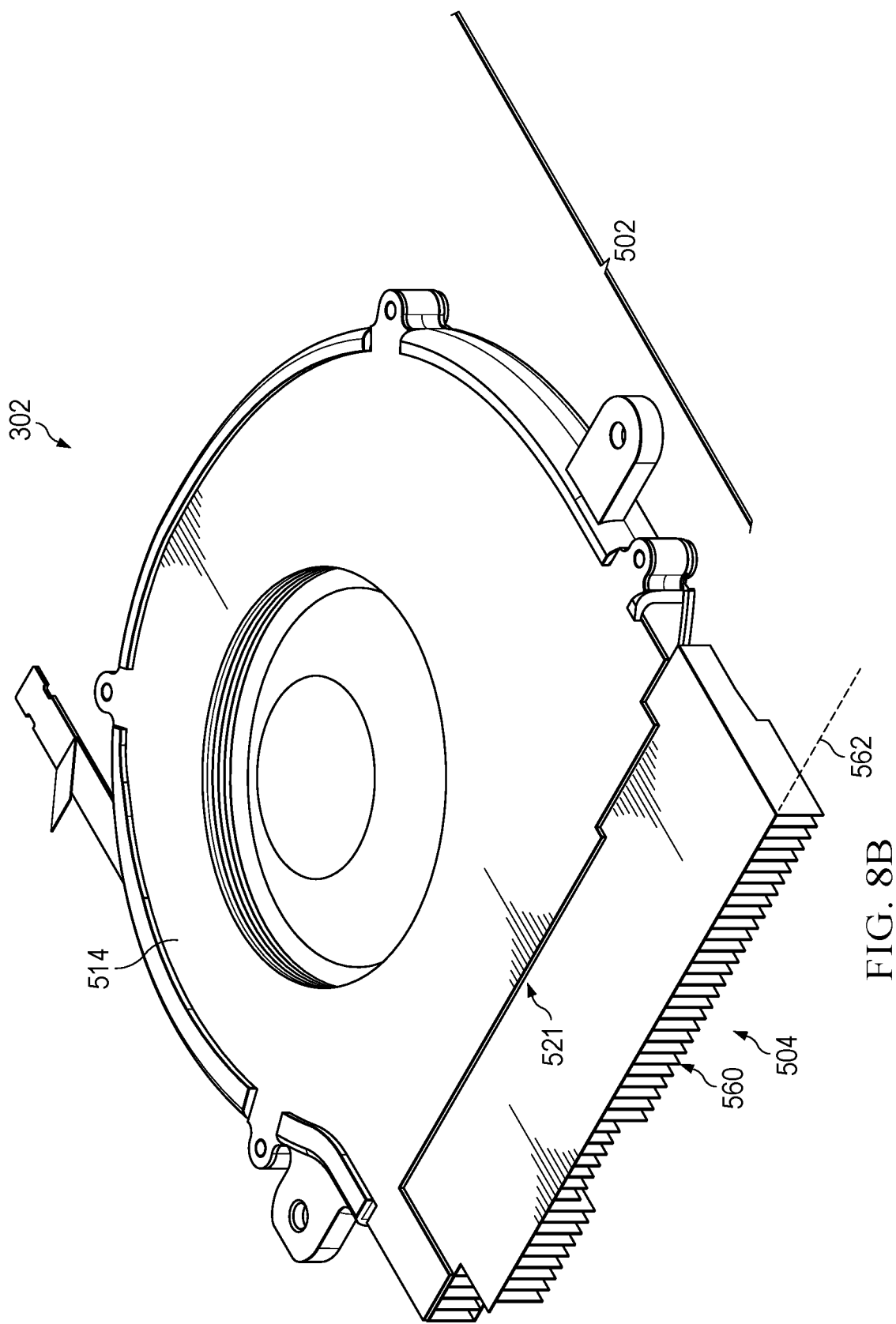
FIG. 8B illustrates an assembled perspective view of the thermal management apparatus, in the second implementation.

FIG. 8A illustrates an exploded perspective view of the thermal management apparatus 302, in a second implementation; and FIG. 8B illustrates an assembled perspective view of the thermal management apparatus 302, in the second implementation. Referring to FIGS. 8A, 8B, the thermal management apparatus 302 can include a blower 502 and a fin-stack 504. The blower 502 can include an impeller 510, a base 512, a cover 514, and an insert 515.

The cover 514 is configured to be coupled to the base 512 through the insert 515. Specifically, the base 512 can include coupling members 520; the cover 514 can include coupling members 522; and the insert 515 can include coupling members 523. The coupling members 520 of the base 512 can be coupled to the coupling members 522 of the cover 514 through the coupling members 523 of the insert 515 to couple the cover 514 to the base 512. Additionally, when the cover 514 is coupled to the base 512, the impeller 510 can be encased by the cover 514 coupled to the base 512, forming the blower 502.

Figure 9:
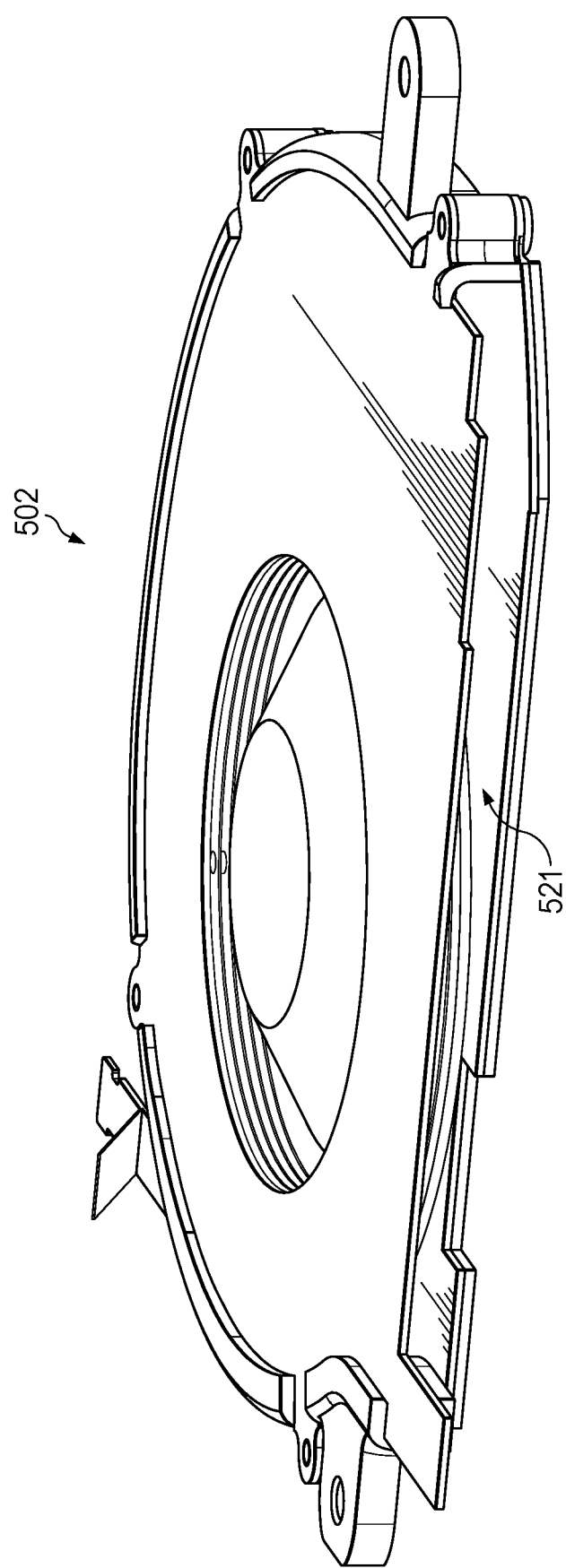
FIG. 9 illustrates a perspective view of a blower of the thermal management apparatus, in the second implementation.

The impeller 510 is configured to direct airflow towards an egress 521 of the blower 502, shown more clearly in FIG. 9. In some examples, the blower 502 can be an ultra-thin plate (UTP) blower.

The fin-stack 504 can include a plate 559 and internal fins 560. The plate 559 can include a perimeter 562. The internal fins 560 can be coupled to the plate 559 and contained within the perimeter 562 (or boundary 562) of the plate 459. The fin-stack 504 can further include external fins 564a, 564b, 564c (collectively referred to as external fins 564). The external fins 564 can be external, or outside of, the perimeter 562. In some examples, the external fins 564 are coupled with one or more of the internal fins 560. In some examples, the external fins 564 are formed with one or more internal fins 560 as a congruent body. The fin-stack 504 can include any number of external fins 454.

Figure 10:
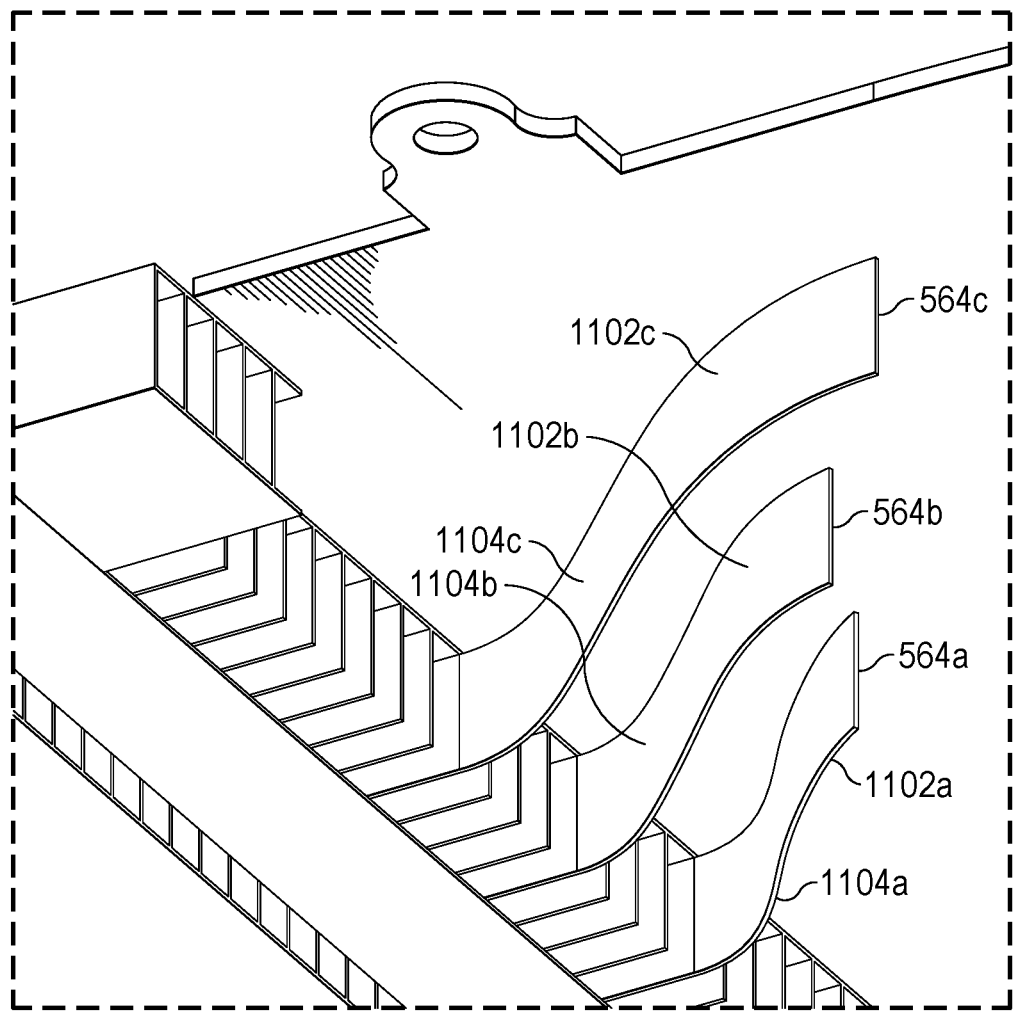
FIG. 10 illustrates a close-up view of a portion of the cover and the fin-stack, in the second implementation.

FIG. 10 illustrates a close-up view of a portion of the cover 512 and the fin-stack 504. Specifically, in the illustrated example, the external fin 564a includes a first curvature 1102a and a second curvature 1104a; the external fin 564b includes a first curvature 1102b and a second curvature 1104b; and the external fin 564c includes a first curvature 1102c and a second curvature 1104c. However, the external fins 564 can include any number of curvatures. Additionally, a subset of the external fins 564 can include a curvature and remaining external fins 564 can be substantially straight.

In some examples, the first curvatures 1102a, 1102b, 1102c (collectively referred to as first curvature 1102) are positive curvatures; and the second curvatures 1104a, 1104b, 1104c (collectively referred to as second curvatures 104) are negative curvatures. In some examples, the first curvatures 1102a, 1102b, 1102c are opposing to the second curvatures 1104a, 1104b, 1104c, respectively.

In some examples, each of the external fins 564 are of a same length. In some examples, a subset of the external fins 564 are of the same length. In some examples, each of the external fins 564 are of differing lengths.

In some examples, a length of the external fin 564c is greater than a length of the external fin 564b. In some examples, the length of the external fin 564b is greater than a length of the external fin 564a.

Referring to FIGS. 8A and 10, in some examples, the external fin 564a is spaced-apart from the impeller 510 a first distance; the external fin 564b is spaced-apart from the impeller 510 a second distance; and the external fin 564c is spaced-apart from the impeller 510 a third distance. In some examples, the third distance is greater than the second distance; and the second distance is greater than the first distance.

Referring to FIG. 8B, to that end, the fin-stack 504 is coupled to the blower 502. The fin-stack 504 is configured to receive the airflow from the impeller 510 (through the egress 521) and transfer heat from the airflow (e.g., remove heat from the airflow). Furthermore, the fin-stack 504 is coupled to the blower 502 such that the external fins 564 are positioned between the base 512 and the cover 514, and more specifically, the external fins 564 are coupled to the cover 514 of the blower 502. In some examples, the external fins 564 are welded to a surface 555 of the cover 514. In some examples, the cover 514 is formed from copper, and the external fins 564 are welded (brazed) to the surface 555 of the cover 514.

Moreover, when the fin-stack 504 is coupled to the blower 502 such that the external fins 564 are positioned between the base 512 and the cover 514 and the external fins 564 are coupled to the cover 514, the external fins 564 are configured to distribute the airflow across the egress 521 and the internal fins 560 of the fin-stack 504. That is, as the impeller 510 directs the airflow towards the egress 521, the external fins 564 distribute such airflow across the egress 521 and the internal fins 560 of the fin-stack 504. In some examples, the external fins 564 distribute such airflow across the egress 521 such that airflow is evenly distributed across the egress 521.

In some examples, the first curvatures 1102 and the second curvatures 1104 of the external fins 564 distribute the airflow across the egress 521 and the internal fins 560 of the fin-stack 504. In some examples, the first curvatures 1102 and the second curvatures 1104 of the external fins 564 distribute the airflow across the egress 521 such that airflow is evenly distributed across the egress 521.

In some examples, the combination of the length and positioning of each of the external fins 564 distribute the airflow across the egress 521 and the internal fins 560 of the fin-stack 504. That is, the length of the external fin 564c greater than the length of the external fin 564b and the external fin 564c is spaced-apart from the impeller 510 the third distance greater than the second distance the external fin 564b is spaced-apart from the impeller 510 distributes the airflow across the egress 521 and the internal fins 560 of the fin-stack 504. In some examples, the length of the external fin 564c greater than the length of the external fin 564b and the external fin 564c is spaced-apart from the impeller 510 the third distance greater than the second distance the external fin 564b is spaced-apart from the impeller 510 distributes the airflow across the egress 521 such that airflow is evenly distributed across the egress 521. That is, the length of the external fin 564b greater than the length of the external fin 564a and the external fin 564b is spaced-apart from the impeller 510 the second distance greater than the first distance the external fin 564a is spaced-apart from the impeller 510 distributes the airflow across the egress 521 and the internal fins 560 of the fin-stack 504. In some examples, the length of the external fin 564b greater than the length of the external fin 564a and the external fin 564b is spaced-apart from the impeller 510 the second distance greater than the first distance the external fin 564a is spaced-apart from the impeller 510 distributes the airflow across the egress 521 such that airflow is evenly distributed across the egress 521.

In some examples, the combination of the first curvatures 1102, the second curvatures 1104, the length, and positioning of each of the external fins 564 distribute the airflow across the egress 521 and the internal fins 560 of the fin-stack 504. That is, the first curvatures 1102 and the second curvatures 1104 of the external fins 564b, 564c and the length of the external fin 564c greater than the length of the external fin 564b and the external fin 564c is spaced-apart from the impeller 510 the third distance greater than the second distance the external fin 564b is spaced-apart from the impeller 510 distributes the airflow across the egress 521 and the internal fins 560 of the fin-stack 504. In some examples, the first curvatures 1102 and the second curvatures 1104 of the external fins 564b, 564c and the length of the external fin 564c greater than the length of the external fin 564b and the external fin 564c is spaced-apart from the impeller 510 the third distance greater than the second distance the external fin 564b is spaced-apart from the impeller 510 distributes the airflow across the egress 521 such that airflow is evenly distributed across the egress 521. That is, the first curvatures 1102 and the second curvatures 1104 of the external fins 564a, 564b and the length of the external fin 564b greater than the length of the external fin 564a and the external fin 564b is spaced-apart from the impeller 510 the second distance greater than the first distance the external fin 564a is spaced-apart from the impeller 510 distributes the airflow across the egress 521 and the internal fins 560 of the fin-stack 504. In some examples, the first curvatures 1102 and the second curvatures 1104 of the external fins 564a, 564b and the length of the external fin 564b greater than the length of the external fin 564a and the external fin 564b is spaced-apart from the impeller 510 the second distance greater than the first distance the external fin 564a is spaced-apart from the impeller 510 distributes the airflow across the egress 521 such that airflow is evenly distributed across the egress 521.

Figure 11A:
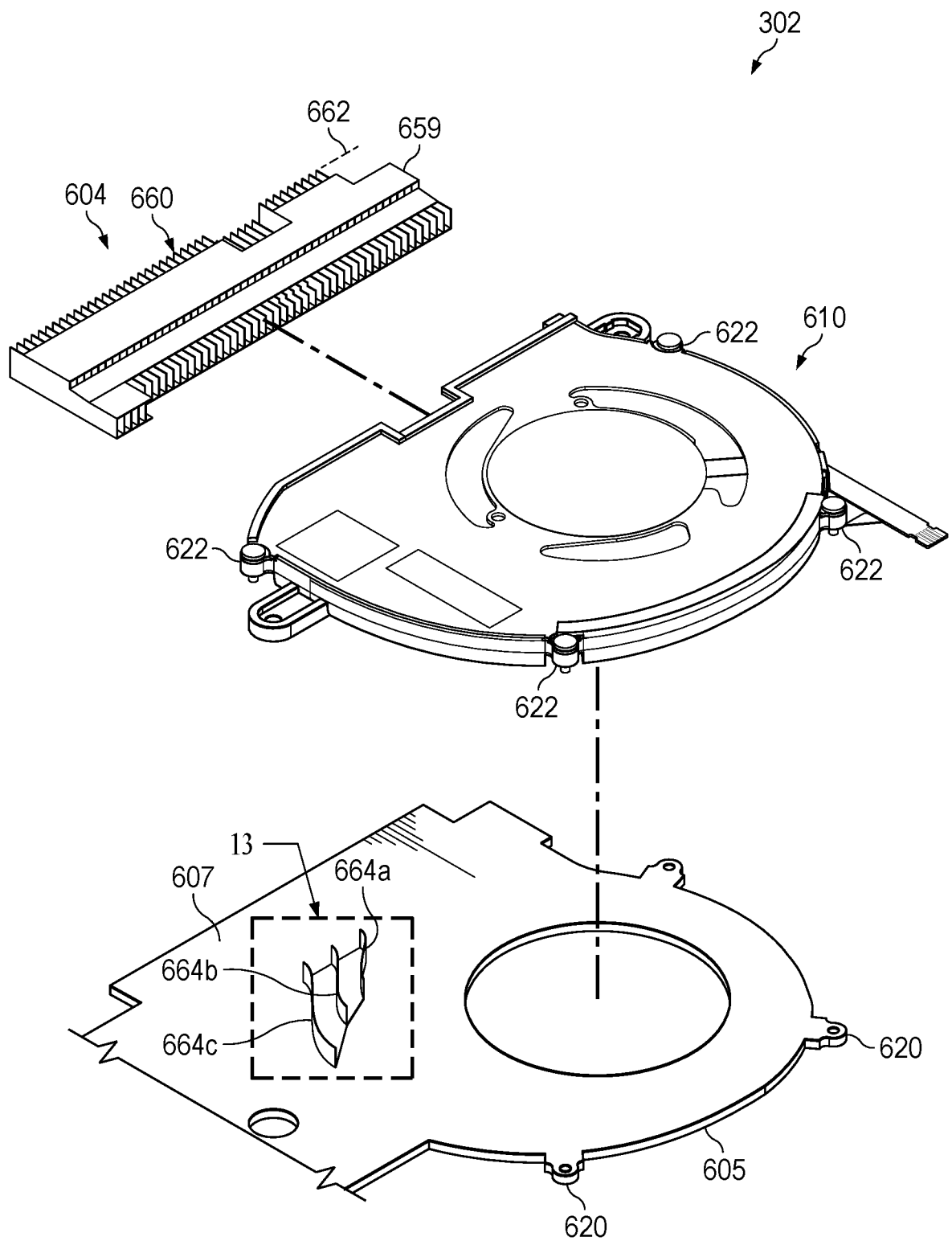
FIG. 11A illustrates an exploded perspective view of the thermal management apparatus, in a third implementation.
Figure 11B:
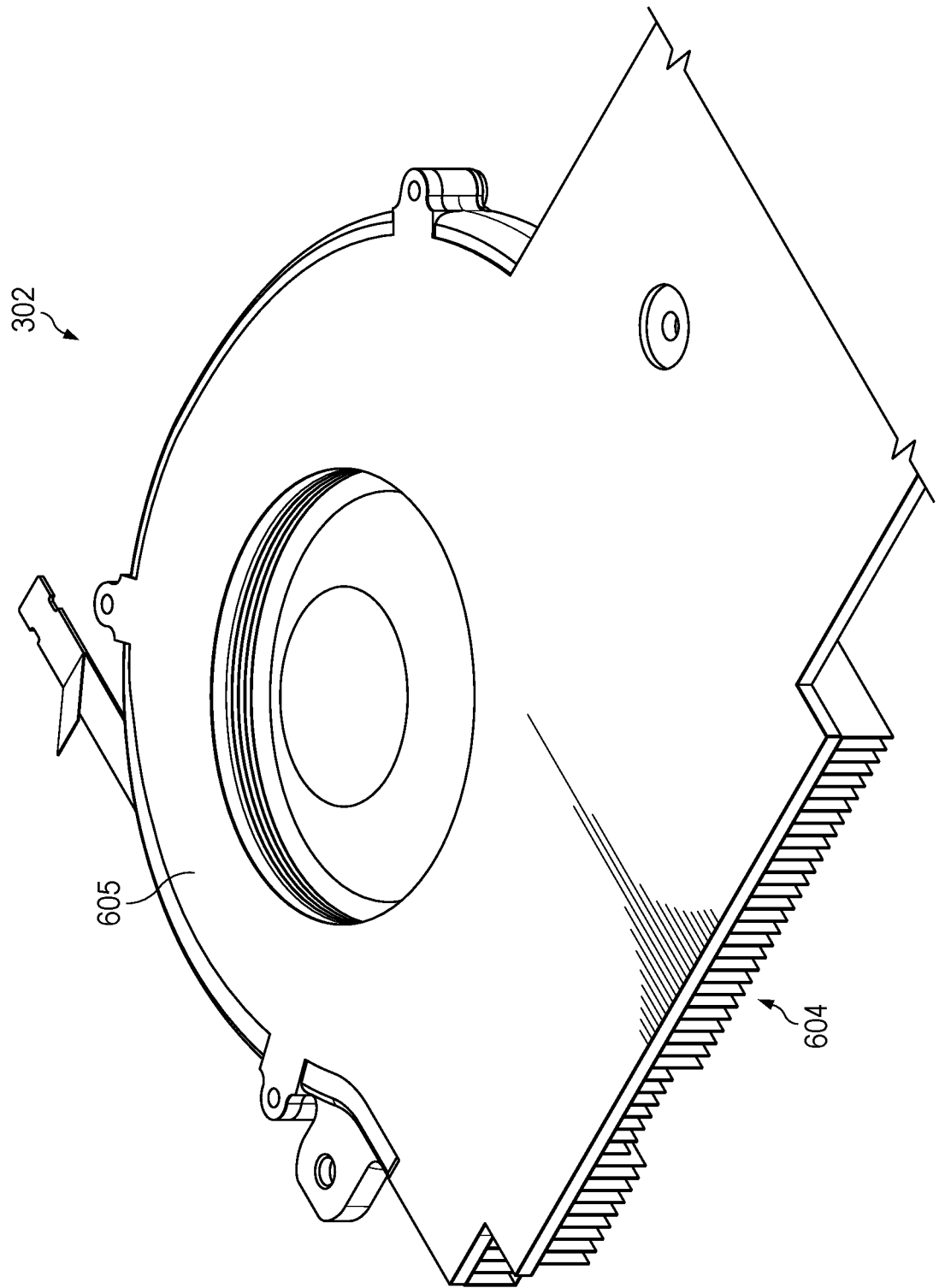
FIG. 11B illustrates an assembled perspective view of the thermal management apparatus, in the third implementation.

FIG. 11A illustrates an exploded perspective view of the thermal management apparatus 302, in a third implementation; and FIG. 11B illustrates an assembled perspective view of the thermal management apparatus 302, in the third implementation. Referring to FIGS. 11A, 11B, the thermal management apparatus 302 can include a blower 610, a fin-stack 604, and a vapor chamber 605.

The vapor chamber 605 can include coupling members 620; and the blower 610 can include coupling members 622. The coupling members 620 of the vapor chamber 605 can be coupled to the coupling members 622 of the blower 610 to couple the blower 610 to the vapor chamber 605.

Figure 12:
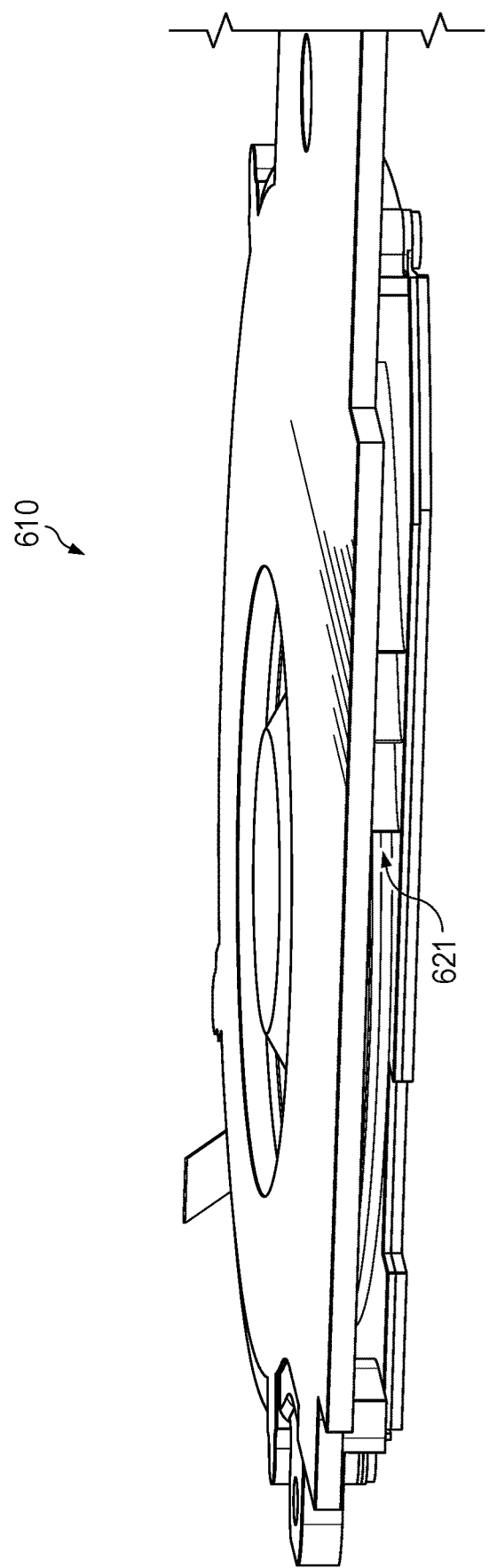
FIG. 12 illustrates a perspective view of a blower of the thermal management apparatus, in the third implementation.

The blower 610 is configured to direct airflow towards an egress 621 of the blower 610, shown more clearly in FIG. 12. In some examples, the blower 610 can be an ultra-thin plate (UTP) blower.

The fin-stack 604 can include a plate 659 and internal fins 660. The plate 659 can include a perimeter 662. The internal fins 660 can be coupled to the plate 659 and contained within the perimeter 662 (or boundary 662) of the plate 659.

The vapor chamber 605 can further include external fins 664a, 664b, 664c (collectively referred to as external fins 664). The external fins 664 can be positioned on a surface 607 of the vapor chamber 605.

Figure 13:
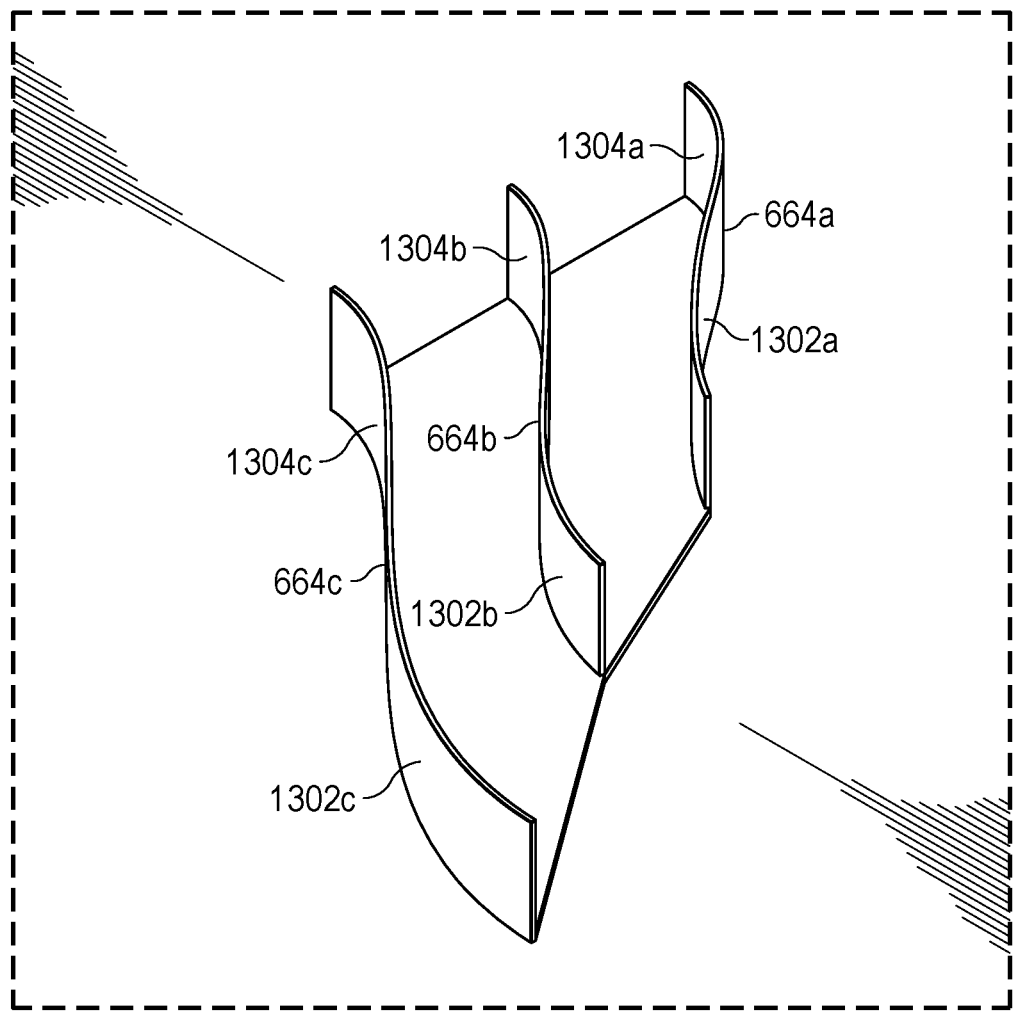
FIG. 13 illustrates a close-up view of a portion of the vapor chamber, in the third implementation.

FIG. 13 illustrates a close-up view of a portion of the vapor chamber 605. Specifically, in the illustrated example, the external fin 664a includes a first curvature 1302a and a second curvature 1304a; the external fin 664b includes a first curvature 1302b and a second curvature 1304b; and the external fin 664c includes a first curvature 1302c and a second curvature 1304c. However, the external fins 664 can include any number of curvatures. Additionally, a subset of the external fins 664 can include a curvature and remaining external fins 664 can be substantially straight.

In some examples, the first curvatures 1302a, 1302b, 1302c (collectively referred to as first curvature 1302) are positive curvatures; and the second curvatures 1304a, 1304b, 1304c (collectively referred to as second curvatures 1304) are negative curvatures. In some examples, the first curvatures 1302a, 1302b, 1302c are opposing to the second curvatures 1304a, 1304b, 1304c respectively.

In some examples, each of the external fins 664 are of a same length. In some examples, a subset of the external fins 664 are of the same length. In some examples, each of the external fins 664 are of differing lengths.

In some examples, a length of the external fin 664c is greater than a length of the external fin 664b. In some examples, the length of the external fin 664b is greater than a length of the external fin 664a.

Referring to FIGS. 11A and 13, in some examples, the external fin 664a is spaced-apart from the blower 610 a first distance; the external fin 664b is spaced-apart from the blower 610 a second distance; and the external fin 664c is spaced-apart from the blower 610 a third distance. In some examples, the third distance is greater than the second distance; and the second distance is greater than the first distance.

Referring to FIG. 11B, to that end, the fin-stack 604 is coupled to the blower 610 and the vapor chamber 605; and the blower 610 is coupled to the vapor chamber 605.

The fin-stack 604 is configured to receive the airflow from the blower 610 (through the egress 621) and transfer heat from the airflow (e.g., remove heat from the airflow). Furthermore, the blower 610 is coupled to the vapor chamber 605 such that the external fins 664 are positioned proximate to the egress 621 of the blower 610.

Moreover, when the blower 610 is coupled to the vapor chamber 605, the external fins 664 are configured to distribute the airflow across the egress 621 and the internal fins 660 of the fin-stack 604. That is, as the blower 610 directs the airflow towards the egress 621, the external fins 664 distribute such airflow across the egress 621 and the internal fins 660 of the fin-stack 604. In some examples, the external fins 664 distribute such airflow across the egress 621 such that airflow is more evenly distributed across the egress 621.

In some examples, the first curvatures 1302 and the second curvatures 1304 of the external fins 664 distribute the airflow across the egress 621 and the internal fins 660 of the fin-stack 604. In some examples, the first curvatures 1302 and the second curvatures 1304 of the external fins 664 distribute the airflow across the egress 621 such that airflow is more distributed across the egress 621.

In some examples, the combination of the length and positioning of each of the external fins 664 distribute the airflow across the egress 621 and the internal fins 660 of the fin-stack 604. That is, the length of the external fin 664c greater than the length of the external fin 664b and the external fin 664c is spaced-apart from the blower 610 the third distance greater than the second distance the external fin 664b is spaced-apart from the blower 610 distributes the airflow across the egress 621 and the internal fins 660 of the fin-stack 604. In some examples, the length of the external fin 664c greater than the length of the external fin 664b and the external fin 664c is spaced-apart from the blower 610 the third distance greater than the second distance the external fin 664b is spaced-apart from the blower 610 distributes the airflow across the egress 621 such that airflow is evenly distributed across the egress 621. That is, the length of the external fin 664b greater than the length of the external fin 664a and the external fin 664b is spaced-apart from the blower 610 the second distance greater than the first distance the external fin 664a is spaced-apart from the blower 610 distributes the airflow across the egress 621 and the internal fins 660 of the fin-stack 604. In some examples, the length of the external fin 664b greater than the length of the external fin 664a and the external fin 664b spaced-apart from the blower 610 the second distance greater than the first distance the external fin 664a is space-apart from the blower 610 distributes the airflow across the egress 621 such that airflow is more evenly distributed across the egress 621.

In some examples, the combination of the first curvatures 1302, the second curvatures 1604, the length, and positioning of each of the external fins 664 distribute the airflow across the egress 621 and the internal fins 660 of the fin-stack 604. That is, the first curvatures 1302 and the second curvatures 1604 of the external fins 664b, 664c and the length of the external fin 664c greater than the length of the external fin 664b and the external fin 664c is spaced-apart from the blower 610 the third distance greater than the second distance the external fin 664b is spaced-apart from the blower 610 distributes the airflow across the egress 621 and the internal fins 660 of the fin-stack 604. In some examples, the first curvatures 1302 and the second curvatures 1604 of the external fins 664b, 664c and the length of the external fin 664c greater than the length of the external fin 664b and the external fin 664c is spaced-apart from the blower 610 the third distance greater than the second distance the external fin 664b is spaced-apart from the blower 610 distributes the airflow across the egress 621 such that airflow is evenly distributed across the egress 621. That is, the first curvatures 1302 and the second curvatures 1604 of the external fins 664a, 664b and the length of the external fin 664b greater than the length of the external fin 664a and the external fin 664b is spaced-apart from the blower 610 the second distance greater than the first distance the external fin 664a is spaced-apart from the blower 610 distributes the airflow across the egress 621 and the internal fins 660 of the fin-stack 604. In some examples, the first curvatures 1302 and the second curvatures 1604 of the external fins 664a, 664b and the length of the external fin 664b greater than the length of the external fin 664a and the external fin 664b is spaced-apart from the blower 610 the second distance greater than the first distance the external fin 664a is spaced-apart from the blower 610 distributes the airflow across the egress 621 such that airflow is evenly distributed across the egress 621.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A thermal management apparatus, including:
    a blower, including:
        an impeller configured to direct airflow towards an egress;
        a base; and
        a cover,
        wherein the cover is coupled to the base to encase the impeller;
    a fin-stack configured to receive the airflow and transfer heat from the airflow, including:
        a plate having a perimeter;
        internal fins coupled to the plate and contained within the perimeter of the plate; and
        external fins extending external to the perimeter of the plate,
        wherein the fin-stack is coupled to the blower such that the external fins are positioned between the base and the cover, the external fins configured to distribute the airflow across the egress and the internal fins of the fin-stack.

2. The thermal management apparatus of claim 1, wherein the thermal management apparatus is included by an information handling system.

3. The thermal management apparatus of claim 1, wherein the base includes coupling members, wherein the external fins are coupled to the coupling members of the base when the fin-stack is coupled to the blower.

4. The thermal management apparatus of claim 1, wherein at least one of the external fins has a curvature.

5. The thermal management apparatus of claim 1, wherein at least one of the external fins has a first curvature and a second curvature, the first curvature a positive curvature and the second curvature a negative curvature.

6. The thermal management apparatus of claim 1, wherein a first external fin of the external fins has a first length and a second external fin of the external fins has a second length, the first length greater than the second length.

7. The thermal management apparatus of claim 6, wherein an end the first external fin is spaced-apart from the impeller a first distance and an end of the second external fin is spaced-apart from the impeller a second distance, the first distance greater than the second distance.

8. The thermal management apparatus of claim 1, wherein the impeller is an ultra-thin plate impeller.

9. The thermal management apparatus of claim 1, wherein the external fins are coupled to the cover of the blower.

10. The thermal management apparatus of claim 1, wherein the external fins are welded to the cover of the blower.

11. The thermal management apparatus of claim 1, wherein the cover of the blower is copper, and the external fins are welded to the cover of the blower.

12. A thermal management apparatus, including:
    a vaper chamber, including external fins positioned on a surface of the vapor chamber;
    a blower configured to direct airflow towards an egress; and
    a fin-stack coupled to the blower, the fin-stack configured to receive the airflow and transfer heat from the airflow, the fin-stack including a plate having a perimeter and internal fins coupled to the plate and contained within the perimeter of the plate,
    wherein the blower is coupled to the vapor chamber such the external fins are positioned proximate to the egress of the blower, the external fins configured to distribute the airflow across the egress and the internal fins of the fin-stack.

13. The thermal management apparatus of claim 12, wherein the thermal management apparatus is included by an information handling system.

14. The thermal management apparatus of claim 12, wherein at least one of the external fins has a curvature.

15. The thermal management apparatus of claim 12, wherein at least one of the external fins has a first curvature and a second curvature, the first curvature a positive curvature and the second curvature a negative curvature.

16. The thermal management apparatus of claim 12, wherein a first external fin of the external fins has a first length and a second external fin of the external fins has a second length, the first length greater than the second length.

17. The thermal management apparatus of claim 16, wherein an end the first external fin is spaced-apart from the blower a first distance and an end of the second external fin is spaced-apart from the blower a second distance, the first distance greater than the second distance.

18. The thermal management apparatus of claim 12, wherein the blower is an ultra-thin plate blower.

* * * * *